(12) United States Patent
Hwang

(10) Patent No.: US 7,977,792 B2
(45) Date of Patent: Jul. 12, 2011

(54) SEMICONDUCTOR DEVICE

(75) Inventor: Jong Taek Hwang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 420 days.

(21) Appl. No.: 11/873,916

(22) Filed: Oct. 17, 2007

(65) Prior Publication Data

US 2008/0157293 A1   Jul. 3, 2008

(51) Int. Cl.
   *H01L 23/48* (2006.01)
   *H01L 23/52* (2006.01)
(52) U.S. Cl. .......................... 257/751; 257/760
(58) Field of Classification Search .................. 257/751, 257/752, 759, 760, E21.584, E21.276, E21.277
   See application file for complete search history.

(56) References Cited

U.S. PATENT DOCUMENTS

| 5,943,585 | A | 8/1999 | May et al. |
| 6,472,336 | B1 * | 10/2002 | Pangrle et al. ................ 438/784 |
| 6,919,638 | B2 * | 7/2005 | Huang et al. .................. 257/758 |
| 2003/0020168 | A1 | 1/2003 | Watanabe et al. |
| 2003/0203652 | A1 | 10/2003 | Bao et al. |

FOREIGN PATENT DOCUMENTS

| CN | 1400659 | 3/2003 |
| EP | 1 282 163 | 5/2003 |
| JP | 2006-278493 | 10/2006 |

* cited by examiner

*Primary Examiner* — Hung Vu
(74) *Attorney, Agent, or Firm* — Sherr & Vaughn, PLLC

(57) ABSTRACT

A semiconductor device including a first insulating layer having a hydroxyl radical formed over a semiconductor substrate; a line layer having a plurality of line patterns formed over the first insulating layer, the plurality if line patterns being arranged such that a spatial gap is provided therebetween; a fluorine-doped second insulating layer formed in the spatial gap between respective line patterns; and a multilayered diffusion prevention layer including a first oxide layer for suppressing an increase of a dielectric constant between the plurality of line patterns and a second oxide layer for preventing the diffusion of fluorine from the fluorine-doped second insulating layer into the first insulating layer.

9 Claims, 3 Drawing Sheets

SEMICONDUCTOR DEVICE

The present application claims priority under 35 U.S.C. 119 to Korean Patent Application No. 10-2006-0137359, filed on Dec. 29, 2006, which is hereby incorporated by reference in its entirety.

BACKGROUND

A semiconductor device may have a highly integrated structure including a line layer having a spatial gap. Such devices, however, exhibit increased parasitic capacitance, thereby causing a delay in signal transfer and also signal interference.

In order to mitigate such problems, a semiconductor device may include a low-k dielectric as an insulating interlayer to fill the spatial gaps and an insulation layer between line patterns. A fluorine-doped oxide layer may be used as an insulating layer. The fluorine-doped oxide layer may have excellent characteristics for filling the narrow spatial gaps between lines and a low dielectric constant (low-k). The F-doped oxide layer may have a dielectric constant smaller than that of an undoped silicon oxide layer to suppress a signal transfer delay of a line. Moreover, the F-doped oxide layer having a good characteristic for filing a narrow gap is used as an inter-line insulating interlayer.

Figure 1:
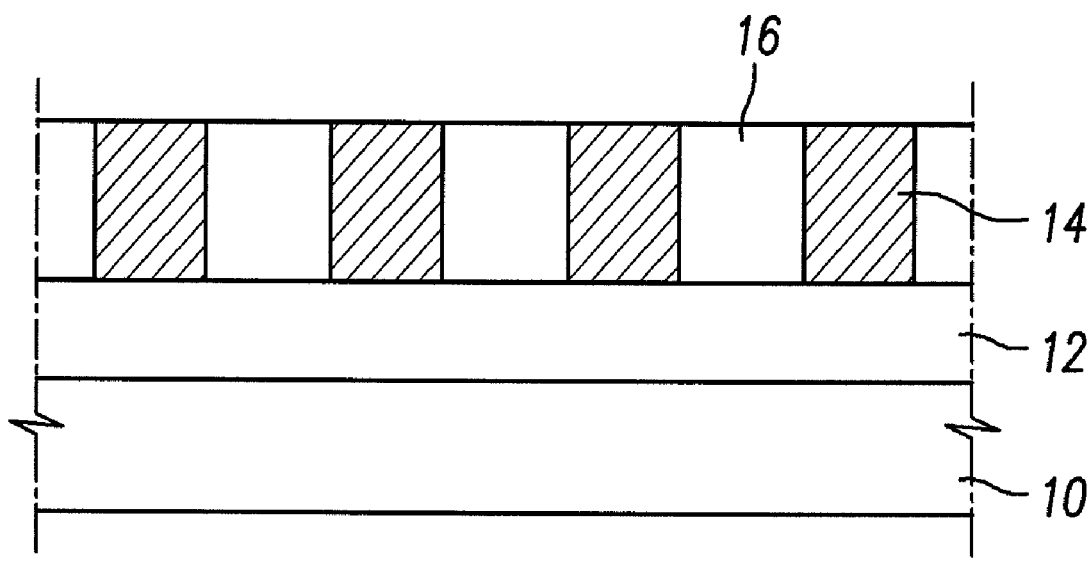

As illustrated in example FIG. 1, a semiconductor device may include first insulating layer 12 containing a hydroxyl radical formed on and/or over semiconductor substrate 10 and a line layer having a plurality of line patterns 14 on and/or over first insulating layer 12.

First insulating layer 12 may be used for interlayer insulation between line patterns 14 and lower line patterns or unit devices. Fluorine-doped ("F-doped") oxide layer 16 may be formed on and/or over first insulating layer 12 to fill a spatial gap area between respective line patterns 14.

As an insulating interlayer or a capping layer beneath a line layer in a semiconductor device, a TEOS layer may be used. The TEOS layer has an intensive structure and a prescribed planarization characteristic and contains OH functional groups therein.

However, F-doped oxide layer 16 directly contacts insulating layer 12. Because fluorine has good diffusivity, F-doped oxide layer 16 reacts with the hydroxyl radical in first insulating layer 12 to form very corrosive HF. The HF induces a problem of forming bubbles within insulating layer 12 or causing corrosion in the metal or oxide.

SUMMARY

Embodiments relate to a semiconductor device having a diffusion preventing layer which prevents reaction between fluorine and hydroxyl radical when forming a F-doped oxide layer over an insulating layer containing the hydroxyl radical.

Embodiments relate to a semiconductor device including a first insulating layer formed over a semiconductor substrate; a diffusion prevention layer formed over the first insulating layer; and a second insulating layer formed over the diffusion preventing layer. In accordance with embodiments, the second insulating layer is doped with fluorine.

Embodiments relate to a method of fabricating a semiconductor device including at least one of the following steps: forming a first insulating layer over a semiconductor substrate; forming a diffusion prevention layer over the first insulating layer; and then forming a second insulating layer over the diffusion prevention layer. In accordance with embodiments, the second insulating layer is doped with fluorine.

Embodiments relate to a semiconductor device including a first insulating layer having a hydroxyl radical formed over a semiconductor substrate; a line layer having a plurality of line patterns formed over the first insulating layer, wherein the plurality if line patterns are arranged such that a spatial gap is provided between respective line patterns; a fluorine-doped second insulating layer formed in the spatial gap between respective line patterns; and a multilayered diffusion prevention layer including a first oxide layer for suppressing an increase of a dielectric constant between the plurality of line patterns and a second oxide layer for preventing the diffusion of fluorine from the fluorine-doped second insulating layer into the first insulating layer.

DRAWINGS

Example FIG. 1 illustrates a semiconductor device.
Example FIGS. 2 to 5 illustrate a semiconductor device, in accordance with embodiments.

DESCRIPTION

Figure 2:
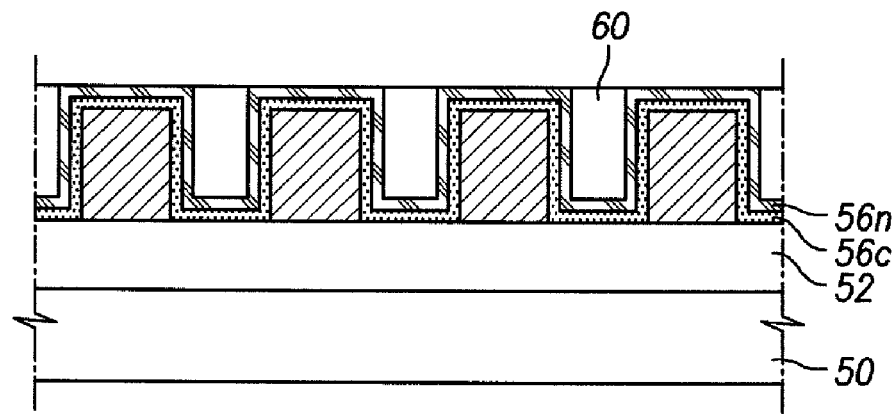
Figure 3:
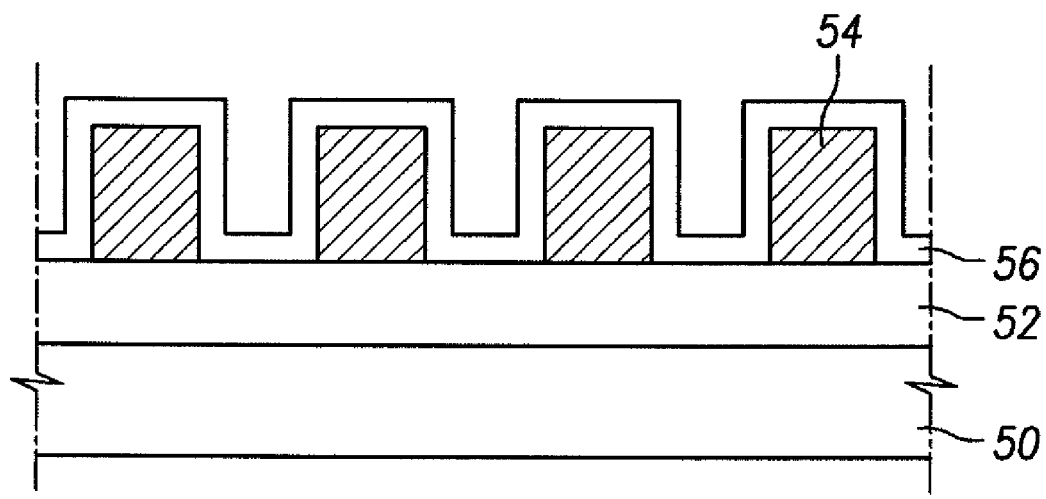

As illustrated in example FIGS. 2 and 3, first insulating layer 52 can be formed on and/or over semiconductor substrate 50. A line layer having a plurality of line patterns 54 can then be formed on and/or over first insulating layer 52. First insulating layer 52 can serve as an insulating interlayer formed for electrical insulation between a lower structure and the line layer or a capping layer of a gate electrode under the line layer.

A spatial gap between respective line patterns 54 can be reduced in correspondence to a highly integrated semiconductor device. It may become necessary to minimize parasitic capacitance between line patterns 54 in a high-performance semiconductor device requiring a fast operational speed. For this, electrical insulation and planarization of line patterns 54 can be performed. The spatial gap between line patterns 54 can be filled up with a second insulating layer 60 serving as an insulating interlayer for a multiple line layer. Second insulating layer can be doped with fluorine (F).

In the semiconductor device in accordance with embodiments, conformal diffusion prevention layer 56 can have a multilayer structure including carbon-doped ("C-doped") oxide layer 56c and nitrogen-doped oxide layer 56n ("N-doped") formed on and/or over line patterns 54 and in a spatial gap area between line patterns 54. Diffusion prevention layers, i.e., C-doped oxide layer 56c and N-doped oxide layer 56n, can be interposed between first insulating layer 52 and F-doped insulating layer 60. The multilayered diffusion prevention layer including C-doped oxide layer 56c and N-doped oxide layer 56n can serve to suppress fluorine from F-doped insulating layer 60 from diffusing into first insulating layer 52.

N-doped oxide layer 56n can have a high density and solid property to facilitate suppression of fluorine atoms from migrating into first insulating layer 52 via N-doped oxide layer 56n. N-doped oxide layer 56n may also have a dielectric constant greater than that of a silicon oxide layer, and thus, can be formed to have a minimum thickness sufficient to prevent diffusion of only fluorine atoms.

C-doped oxide layer 56c can be used as a layer capable of preventing fluorine diffusion and the suppression of a dielectric constant increase. C-doped oxide layer 56c can be stacked together with N-doped oxide layer 56n to form diffusion prevention layer 56. C-doped oxide layer 56c can have a low dielectric constant that facilitates the suppression of fluorine diffusion. Diffusion prevention layer 56 including the stacked C-doped oxide layer 56c and N-doped oxide layer 56n facilitates the prevention of fluorine diffusion toward first insulating layer 52 and the suppression of a dielectric constant increase.

N-doped oxide layer 56n can be formed with a thickness of approximately 300 Å and the C-doped oxide layer 56c can be formed with a thickness of approximately 200 Å.

A TEOS layer containing hydroxyl radical can be used as an insulating interlayer between a line layer and a lower structure or a capping layer of a gate electrode. In which case, an F-doped insulating layer can contact the TEOS insulating layer containing an hydroxyl radical to trigger a reaction between fluorine and the hydroxyl radical. Such a reaction generates bubbles within the insulating layer or HF. Thus, the HF causes corrosion of the oxide and metal.

In the semiconductor device in accordance with embodiments, diffusion preventing layer 56 can be interposed between the second insulating layer 60 doped with fluorine and first insulating layer 54 containing a hydroxyl radical, thereby suppressing the fluorine from diffusing into first insulating layer 54.

As illustrated in example FIG. 3, first insulating layer 52 can be formed on and/or over semiconductor substrate 50. A line layer having a plurality of line patterns 54 can then be formed on and/or over first insulating layer 52. First insulating layer 52 can be an insulating layer containing a hydroxyl radical. Alternatively, first insulating layer 52 can be a TEOS layer.

Oxide layer 56 can be formed conformal on and/or over semiconductor substrate 50 including line patterns 54.

Figure 4:
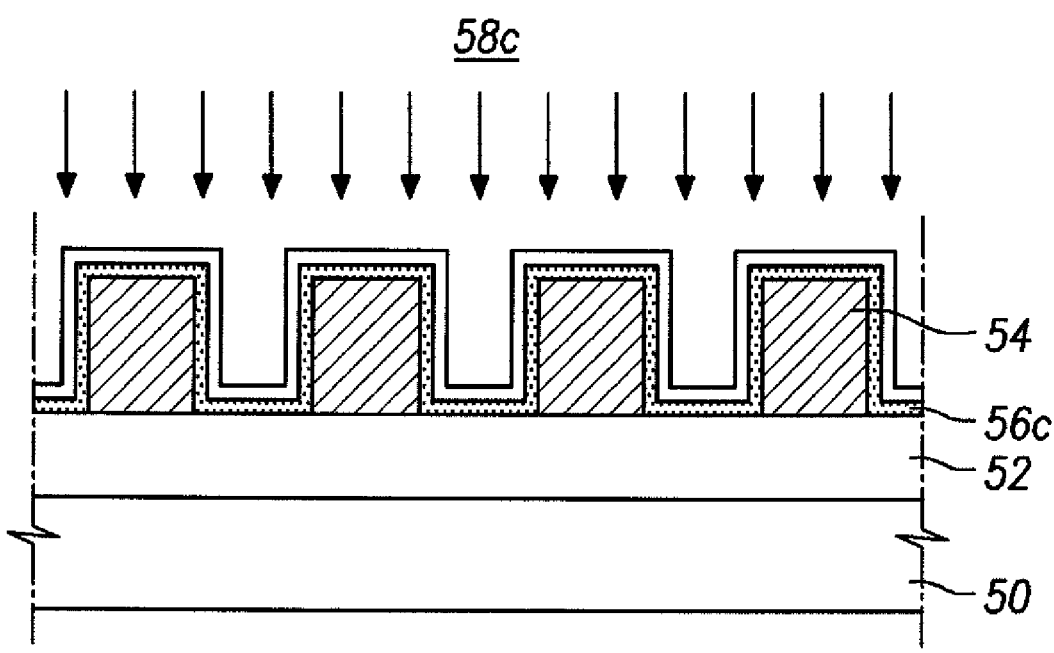

As illustrated in example FIG. 4, carbon ions 58c can be implanted into oxide layer 56 to transform at least a portion of oxide layer 56 into C-doped oxide layer 56c. Oxide layer 56 can be formed having a thickness of approximately 500 Å and the C-doped oxide layer 56c can be formed by implanting carbon ions into oxide layer 56 having a thickness of approximately 200 Å. The carbon ion implantation can be executed on conditions of energy of 200 to 450 keV and a dosage amount of between approximately $2 \times 10^{13}$ to $2 \times 10^{14}$ atoms/cm$^2$.

Figure 5:
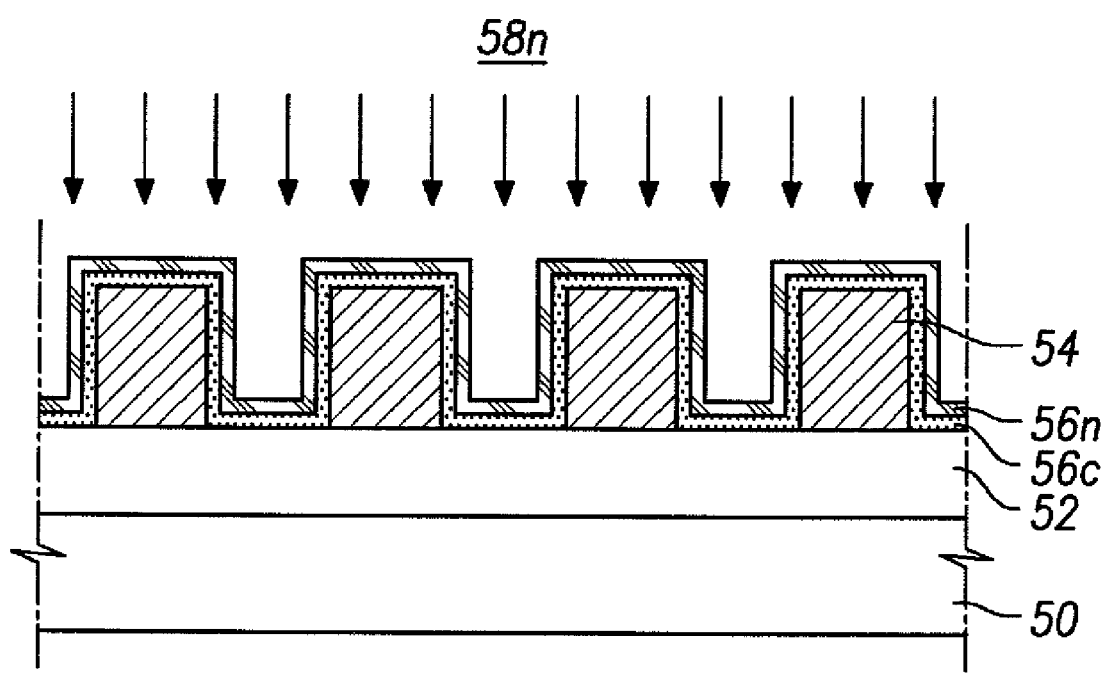

As illustrated in example FIG. 5, nitrogen ions 58n can be implanted into oxide layer 56 above C-doped oxide layer 56c. The nitrogen ion implanted oxide layer is thus, transformed into N-doped oxide layer 56n. N-doped oxide layer 56n can be formed having a thickness sufficient to prevent fluorine diffusion.

In accordance with embodiments, the thickness of N-doped oxide layer 56n can be approximately 300 Å. The thickness can be adjusted in correspondence to diffusion conditions for subsequent processes and device operating conditions and fluorine diffusion prevention according to fluorine containment, and the like. For instance, the nitrogen ion implantation can be carried out with approximately 150~350 keV energy at a dosage amount of between approximately $5 \times 10^{13}$ atoms/cm$^2$ to $5 \times 10^{14}$ atoms/cm$^2$.

N-doped oxide layer 56n plays a role as a diffusion prevention layer while C-doped oxide layer 56c can be used to suppress an increase of the dielectric constant between the metal lines due to N-doped oxide layer 56n.

F-doped oxide layer 60 can be formed on and/or over diffusion preventing layer 56 to fill the spatial gaps between line patterns 54. F-doped oxide layer 60 can have a low dielectric constant capable of lowering parasitic capacitance between line patterns 54. F-doped oxide layer 60 can also have good mobility to effectively fill narrow spatial gaps between line patterns 54.

The semiconductor in accordance with embodiments is advantageous in providing a diffusion prevention layer between an F-doped oxide layer and an oxide layer having a hydroxyl radical in order to prevent fluorine from reacting with the hydroxyl radical. Secondly, HF formation can be suppressed by interrupting the reaction between fluorine and a hydroxyl radical, whereby bubble generation within an insulation layer and corrosion of oxide and metal can be prevented. Hence, reliability of a line layer and an insulating interlayer can be enhanced.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   a first insulating layer formed over a semiconductor substrate;
   a diffusion prevention layer formed over the first insulating layer; and
   a second insulating layer formed over the diffusion preventing layer,
   wherein the second insulating layer is doped with fluorine,
   wherein the diffusion prevention layer comprises a multiplayer structure,
   wherein the multilayer structure comprises a first oxide layer for suppressing an increase of a dielectric constant between metal lines and a second oxide layer for preventing the diffusion of fluorine from the second insulating layer into the first insulating layer, and
   wherein the first oxide layer comprises a carbon-doped layer and the second oxide layer comprises a nitrogen-doped layer.

2. The apparatus of claim 1, further comprising a line layer having a plurality of line patterns formed over the first insulating layer, wherein the plurality if line patterns are arranged such that a spatial gap is provided between respective line patterns.

3. The apparatus of claim 1, wherein the carbon-doped layer and the nitrogen-doped layer are formed in a stack arrangement such that the carbon-doped layer is formed over and directly contacts both the plurality of line patterns and the first insulating layer and the nitrogen-doped layer is formed over and directly contacts the carbon-doped layer.

4. The apparatus of claim 3, wherein the nitrogen-doped layer has a thickness sufficient to prevent fluorine diffusion.

5. The apparatus of claim 4, wherein the nitrogen-doped layer has a thickness of approximately 300 Å.

6. The apparatus of claim 3, wherein the carbon-doped layer has a thickness of approximately 200 Å.

7. The apparatus of claim 1, wherein the first insulating layer includes a hydroxyl radical.

8. The apparatus of claim 1, wherein the first insulating layer comprises a TEOS layer.

9. An apparatus comprising:
a first insulating layer having a hydroxyl radical formed over a semiconductor substrate;
a line layer having a plurality of line patterns formed over the first insulating layer, wherein the plurality of line patterns are arranged such that a spatial gap is provided between respective line patterns;
a fluorine-doped second insulating layer formed in the spatial gap between respective line patterns; and
a multilayered diffusion prevention layer including a first oxide layer for suppressing an increase of a dielectric constant between the plurality of line patterns and a second oxide layer for preventing the diffusion of fluorine from the fluorine-doped second insulating layer into the first insulating layer.

* * * * *